United States Patent [19]

Tanimoto

[11] 3,838,344

[45] Sept. 24, 1974

[54] FREQUENCY MULTIPLYING CIRCUIT

[75] Inventor: Kenji Tanimoto, Tokyo, Japan

[73] Assignee: Fuji Xerox Co., Ltd., Tokyo, Japan

[22] Filed: Dec. 20, 1972

[21] Appl. No.: 316,753

[30] Foreign Application Priority Data

Dec. 23, 1971 Japan .............................. 46-104092

[52] U.S. Cl. ...................... 328/20, 328/38, 307/225, 307/265, 307/273, 307/279

[51] Int. Cl. ............................................ H03b 19/00

[58] Field of Search ........ 328/20, 38; 307/225, 279, 307/273, 265

[56] References Cited

UNITED STATES PATENTS

| | | | |
|---|---|---|---|
| 3,204,124 | 8/1965 | Durio | 307/88.5 |
| 3,304,437 | 2/1967 | Dano | 307/88.5 |
| 3,304,439 | 2/1967 | Stratton et al. | 307/88.5 |
| 3,569,737 | 3/1971 | Bauer et al. | 307/233 |
| 3,571,732 | 3/1971 | Richardson | 328/155 |
| 3,696,254 | 10/1972 | Bertolini et al. | 307/273 |
| 3,727,082 | 4/1973 | Codina | 307/265 |

*Primary Examiner*—Rudolph V. Rolinec
*Assistant Examiner*—Joseph E. Clawson, Jr.
*Attorney, Agent, or Firm*—J. T. Martin; Gerald J. Ferguson, Jr.; Joseph J. Baker

[57] ABSTRACT

Frequency multiplying circuitry comprising monostable multivibrator means responsive to a pulse train for multiplying the frequency thereof; frequency demodulating means responsive to the pulse train for developing a control voltage, the magnitude of which is proportional to the frequency of the pulse train; and means for applying the control voltage to the monostable multivibrator for varying the length of time it remains in its unstable state; whereby the length of time the multivibrator remains in its unstable state is inversely proportional to the frequency of the pulse train.

10 Claims, 2 Drawing Figures

PATENTED SEP 24 1974 3,838,344

FREQUENCY MULTIPLYING CIRCUIT

CROSS REFERENCES TO RELATED APPLICATIONS

This application is related to a copending application, entitled "Trigger Circuit for Use with Multivibrators," filed herewith by the inventor of the instant application. The above copending application is hereby incorporated herein by reference.

BACKGROUND OF THE INVENTION

1. Field of the Invention

This invention relates to improvements in a frequency multiplying circuit including a monostable multivibrator which provides frequency multiplication where the duty cycle or ratio of the multivibrator may remain substantially constant even when the frequency of the input signal varies.

2. Description of the Prior Art

In prior art frequency multiplying circuits of utilizing monostable multivibrators, the multivibrator is actuated by a trigger pulse only, and therefore, such circuitry is defective since stable frequency multiplying with substantially constant duty ratio cannot be obtained when the input frequency varies.

SUMMARY OF THE INVENTION

An object of this invention is to provide an improved and simple frequency multiplying circuit utilizing a multivibrator where the duty cycle or ratio of the multivibrator may remain substantially constant even when the frequency of the input signal varies.

Other objects and advantages of this invention will become apparent upon reading the appended claims in conjunction with the following detailed description and the attached drawings.

DESCRIPTION OF PREFERRED EMBODIMENT

Figure 1:
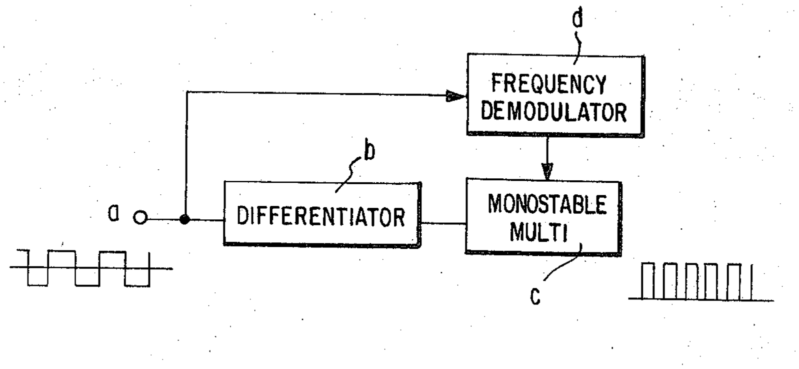
FIG. 1 is an illustrative embodiment of a prior art frequency mutlivibrator using a monostable multivibrator.

As shown in FIG. 1, an input signal *a* which typically is a pulse train is differentiated in a differentiator *b* to form a series of trigger pulses. These pulses are applied to a monostable multivibrator *c*. At the same time, the input signal *a* is also applied to a frequency demodulator *d* for obtaining voltage signal, the magnitude of which is proportional to the frequency of the input signal. The voltage level of the voltage signal may be set to a suitable value corresponding to a particular input frequency, and thereafter, the voltage signal and the trigger pulses are applied to the monostable multivibrator *c* simultaneously, so that the input frequency of signal *a* is multiplied, the duty ratio of the multivibrator being maintained substantially constant even when the input frequency varies.

Figure 2:
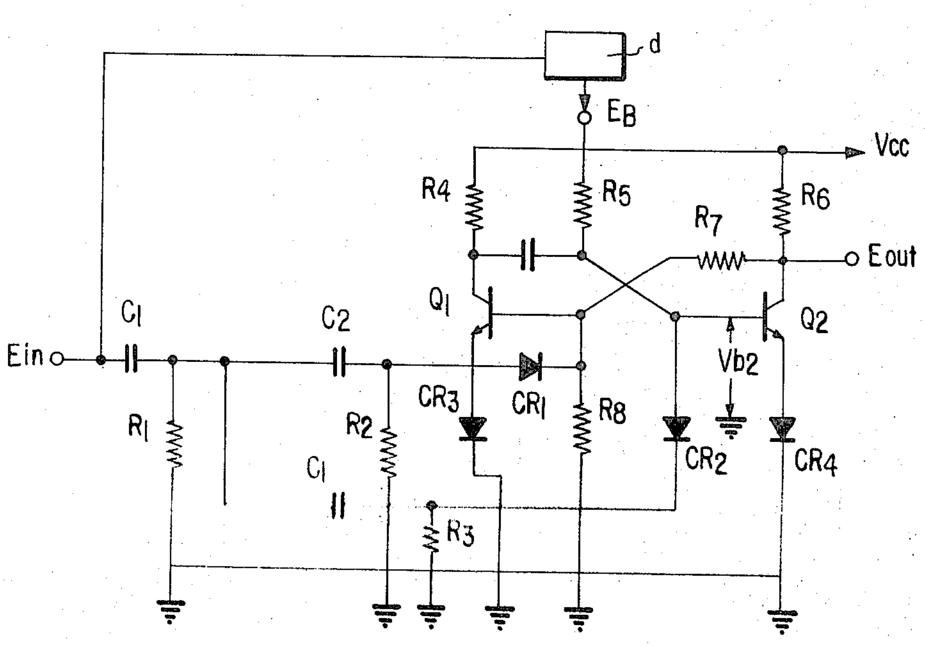
FIG. 2 is an illustrative embodiment of the invention.

An illustrative embodiment of this invention will now be described with reference to FIG. 2. A signal is applied to the input terminal Ein. This signal may be a frequency modulated signal. It is differentiated in a differentiation circuit comprising a capacitor $C_1$ and a resistor $R_1$ and transformed into a series of trigger pulses which alternately change between positive and negative polarity. The pulses thus obtained trigger a monostable multivibrator comprising semiconductor control elements $Q_1$ and $Q_2$. Thus, the output signal at the output terminal Eout of the multivibrator has a frequency two times that of the input signal. It should be noted that the pulse width of the output signal is determined by a capacitor $C_4$ connecting the collector of the element $Q_1$ with the base of the element $Q_2$ and by a resistor $R_5$ of a base potential supplying circuit Eb. The pulse width can optionally be established by changing the capacitance of capacitor $C_4$ and the resistance of resistor $R_5$. Therefore, the pulse width of the output signal can also be controlled by changing the base potential to Eb even though the capacitor $C_4$ and resistor $R_5$ are unchanged.

This invention is based on the above mentioned facts. Thus, the input signal Ein is demodulated by frequency demodulator d so as to transform the variation of input frequency into a voltage , $E_B$, the magnitude of which is proportional to the input frequency. $E_B$ is applied to the multivibrator as a base potential. Thus, starting with the stable state of the multivibrator circuit in which the element $Q_2$ is "on" and the element $Q_1$ is "off," the capacitor $C_4$ is charged to a voltage corresponding to Vcc, and at an initial time $t_1$, the multivibrator is switched so that the element $Q_1$ becomes "on". The base potential of element $Q_2$ is decreased to —Vcc at the instant the collector of element $Q_1$ becomes approximately zero volts. Thus the voltage between both ends of the resistor $R_5$ of the base potential supplying circuit becomes $Vcc + Eb$. Thereafter, the base potential $Vb_2$ of element $Q_2$ increases gradually in accordance with the following equation as the electric charge in capacitor $C_4$ discharges through resistor $R_5$.

$$Vb_2 = E_B - (Vcc + E_B)e^{-t/CR} \quad (1)$$

At time $t_2$, the base potential $Vb_2$ passes through zero volts, and when it becomes higher than $V_{BE}$(the voltage at which $Q_2$ is forward biased), collector current starts to flow and the switching action commences to return the monostable multivibrator to its stable state.

By assuming the pulse width, $T$, is approximately determined when $Vb_2 = 0$, $T$ which is the time between time $t_2$ and time $t_1$ is determined approximately as follows:

From Equation (1)

$$0 = E_B - (Vcc + E_B)e^{-t/CR}$$

$$E_B/Vcc + E_B = \mathrm{i}\ e^{-t/CR}$$

$$t/CR = \log e^{\ Vcc + E_B/E_B}$$

$$T = CR \log e(1 + Vcc)/E_B \quad (2)$$

Therefore, pulse width of the output signal of the multivibrator circuit can be controlled by base potential $E_B$ which is applied to the multivibrator circuit, and thus, the principle of this invention is clarified.

As described above, according to this invention, the input signal is differentiated to form trigger pulses, and the input signal is also transformed by a demodulator *d* into a control signal which is proportional to input frequency. The trigger pulses and the control signal are applied to monostable multivibrator *c* so that the output pulse width of the multivibrator can be controlled by the control signal and thus, frequency multiplying where the duty cycle or ratio of the multivibrator is substantially constant can be achieved by a simple circuit even when input frequency varies.

Numerous modifications of the invention will become apparent to one of ordinary skill in the art upon reading the foregoing disclosure. During such a reading it will be evident that this invention provides unique frequency multiplying circuit for accomplishing the objects and advantages herein stated.

What is claimed is:

1. Frequency multiplying circuitry comprising:

a single monostable multivibrator means responsive to an input signal for multiplying the frequency thereof by a factor of two;

frequency demodulating means responsive to the input signal for developing a control signal, the magnitude of which is proportional to the frequency of the input signal; and means for applying the control signal to the monostable multivibrator for varying the length of time it remains in its unstable state so that said length of time is substantially inversely proportional to the frequency of the input signal; and trigger means including (a) first means responsive to positive-going transitions in said input signal for directly applying a first trigger signal to a normally conducting control element to switch said monostable multivibrator means to its unstable state and (b) second means directly responsive to negative-going transitions in said input signal for directly applying a second trigger signal to a normally non-conducting control element to again switch said monostable multivibrator to its unstable state and (c) current blocking means connected between said first and second means for preventing a direct current interaction therebetween.

2. A frequency multiplying circuit as in claim 1 where said monostable multivibrator includes a timing circuit for establishing the length of time it remains in its unstable state, said control signal being applied to said timing circuit for varying the length of time established thereby so that the length of time said multivibrator remains at its unstable state is substantially inversely proportional to the frequency of the input signal.

3. A frequency multiplying circuit as shown in claim 2 where said timing circuit comprises at least a resistor and a tuning capacitor and where said control signal varies the length of time for discharging said capacitor during the unstable state of said multivibrator.

4. A frequency multiplying circuit as in claim 3 where said timing circuit establishes the length of time said normally conducting control element is turned off whenever said multivibrator is switched by said input signal.

5. A frequency multiplying circuit as in claim 4 where said control elements are NPN transistors and where said capacitor is connected between the collector of the normally non-conducting transistor and the base of the normally conducting transistor and said resistor is connected between the frequency demodulating means and the base of said normally conducting transistor whereby said capacitor discharges through said resistor whenever either said normally conducting transistor is turned off or said normally non-conducting transistor is turned on.

6. A frequency multiplying circuit as in claim 5 where said input signal is a pulse train and said trigger means includes means for differentiating said input pulse train so that positive spikes are produced for each positive-going transition in the pulse train and applied to said one control element and negative spikes are produced for the negative-going transitions and applied to said other control element.

7. A frequency multiplying circuit as in claim 7 where said positive spikes are directly applied to the normally non-conducting control element to turn it on and said negative spikes are directly applied to said normally conducting control element to turn it off.

8. A frequency multiplying circuit as in claim 7 where said trigger means includes a first diode with its positive pole connected to said differentiating means and its negative pole connected to said normally non-conducting control element and a second diode with its negative pole connected to said differentiating means and its positive pole connected to said normally conducting transistor, said current blocking means comprising a first blocking capacitor interposed between said first diode and said differentiating means and a second blocking capacitor interposed between said second diode and said differentiating means.

9. A frequency multiplying circuit as in claim 8 where said control elements are NPN transistors and said diodes are directly connected to the respective bases of said transistors.

10. A frequency multiplying circuit as in claim 9 where said timing capacitor is connected between the collector of the normally non-conducting transistor and the base of the normally conducting transistor and said resistor is connected between the frequency demodulating means and the base of said normally conducting transistor whereby said timing capacitor discharges through said resistor whenever either said normally conducting transistor is turned off or said normally non-conducting transistor is turned on.

* * * * *